United States Patent [19]

Hieda

[11] Patent Number: 5,012,308
[45] Date of Patent: Apr. 30, 1991

[54] SEMICONDUCTOR MEMORY DEVICE

[75] Inventor: Katsuhiko Hieda, Yokohama, Japan

[73] Assignee: Kabushiki Kaisha Toshiba, Kawasaki, Japan

[21] Appl. No.: 220,369

[22] Filed: Jul. 11, 1988

Related U.S. Application Data

[63] Continuation of Ser. No. 767,848, Aug. 21, 1985, abandoned.

[30] Foreign Application Priority Data

Aug. 27, 1984 [JP] Japan ................................. 59-178071

[51] Int. Cl.$^5$ ..................... H01L 29/78; H01L 29/92; H01L 27/02
[52] U.S. Cl. ........................................ 357/23.6; 357/41
[58] Field of Search ................................. 357/23.6, 41

[56] References Cited

FOREIGN PATENT DOCUMENTS

| 0108390 | 5/1984 | European Pat. Off. | ............ 357/23.6 |
| 0164829 | 12/1985 | European Pat. Off. | ............ 357/23.6 |
| 0003260 | 1/1983 | Japan | ................................. 357/23.6 |
| 0212161 | 12/1983 | Japan | ................................. 357/23.6 |
| 0213460 | 12/1983 | Japan | ................................. 357/23.6 |
| 0141262 | 8/1984 | Japan | ................................. 357/23.6 |
| 0136367 | 7/1985 | Japan | ................................. 357/23.6 |

Primary Examiner—Michael C. Wimer
Assistant Examiner—Peter Toby Brown
Attorney, Agent, or Firm—Oblon, Spivak, McClelland, Maier & Neustadt

[57] ABSTRACT

A dynamic random access memory has a semiconductive substrate in which grooves are formed such that each groove has side walls and a bottom portion and which has a predetermined conductivity type. Each memory cell formed on the substrate has a transistor and a capacitor buried in the groove. The capacitor is constituted by a first conductive layer and a second conductive layer. The first conductive layer is connected to a source region of the transistor and has a layer portion extending in the groove along the side wall thereof. The second conductive layer is insulated from the first conductive layer, buried in the groove to oppose the first conductive layer and allows the conductive layer to store charge carriers in response to a voltage applied between the first and second conductive layers. The second conductive layer serves as a common electrode for all the memory capacitors formed on the substrate.

8 Claims, 4 Drawing Sheets

SEMICONDUCTOR MEMORY DEVICE

This application is a continuation of application Ser. No. 767,848, filed on Aug. 21, 1985, now abandoned.

BACKGROUND OF THE INVENTION

The present invention relates to semiconductor memories and, more particularly, to a dynamic random access memory wherein each memory cell is constituted by a transistor and a capacitor.

As is well known, a dynamic random access memory (to be referred to as a "dRAM" hereinafter) has a plurality of memory cells formed in a matrix manner on a substrate. Address and data lines extend along column and row directions, respectively, to designate read/write of data from/into a desired cell. Each cell typically consists of a MOS transistor which is switched on/off in response to an address designation and a MOS capacitor for storing data carriers supplied through the transistor.

In a dRAM having the above-mentioned structure, the level of a data signal read out from a cell directly depends on the maximum charge which can be stored in each memory cell of the dRAM. Therefore, the capacitance of the cell capacitor must be increased in order to increase the level of the readout data signal. The cell capacitance is determined in accordance with the thickness and area of a gate insulation film of the MOS capacitor in the cell. Therefore, in order to increase the capacitance of the capacitor, the gate insulation film must be made as thin as possible, and/or the area of the capacitor region must be increased as much as possible. However, there are limitations in manufacturing a thin gate insulation film, and an increase in the capacitor area results in degradation in cell packing density of the dRAM, thereby preventing manufacture of a dRAM having a high packing density.

Occurrence of "soft-error" is also a big problem in a dRAM having the above-mentioned structure. A "soft-error" problem means the phenomenon wherein radiation, such as u rays generated from a radioactive material (contained in a very small amount in a package), becomes incident on a silicon substrate to generate a large number of electron-hole pairs therein, and the electron-hole pairs cause noise, thereby causing malfunction of the dRAM. As a result, it has been very difficult to improve the maximum charge storage amount without degrading memory density.

SUMMARY OF THE INVENTION

It is therefore an object of the present invention to provide a new and improved semiconductor memory device which has a high packing density and which is capable of reliable data read/write.

According to a semiconductor memory of the present invention, grooves are formed in a surface area of a semiconductive substrate having a predetermined conductivity type such that each groove has side walls and a bottom portion. A plurality of memory cells are formed o the substrate in a matrix manner. Each memory cell consists of one transistor and one capacitor. In each memory cell, the transistor is formed on the substrate surface area while the capacitor is buried in the groove. Unlike in a conventional device, a capacitor electrode of the capacitor is not comprised of a semiconductor diffusion layer formed in the substrate. The capacitor electrode includes a first conductive layer buried in the groove and a second conductive layer which is insulated from the first conductive layer and buried in the groove to oppose the first conductive layer. The first conductive layer is connected to a source region of the transistor and has a layer portion extending in the groove along the side wall of the groove. The second conductive layer serves as a common electrode for all the memory capacitors formed on the substrate and allows the first conductive layer to store charge carriers in response to a voltage applied between the first and second conductive layers.

The capacitor electrode is not comprised of a semiconductor diffusion layer formed in the substrate but a conductive layer. Therefore, generation of hole-electron pairs in the substrate can be prevented, thereby eliminating "soft-error". Since the cell capacitors are buried in the grooves, the effective area of the capacitor can be substantially increased without increasing the two-dimensional area occupied by the cell capacitor. Therefore, the maximum charge storage amount of each cell can be increased and the semiconductor memory can be highly integrated. The above-mentioned object of the present invention is achieved in this manner.

BRIEF DESCRIPTION OF THE DRAWINGS

The present invention is best understood by reference to the accompanying drawings, in which.

DETAILED DESCRIPTION OF THE PREFERRED EMBODIMENTS

Figure 1:
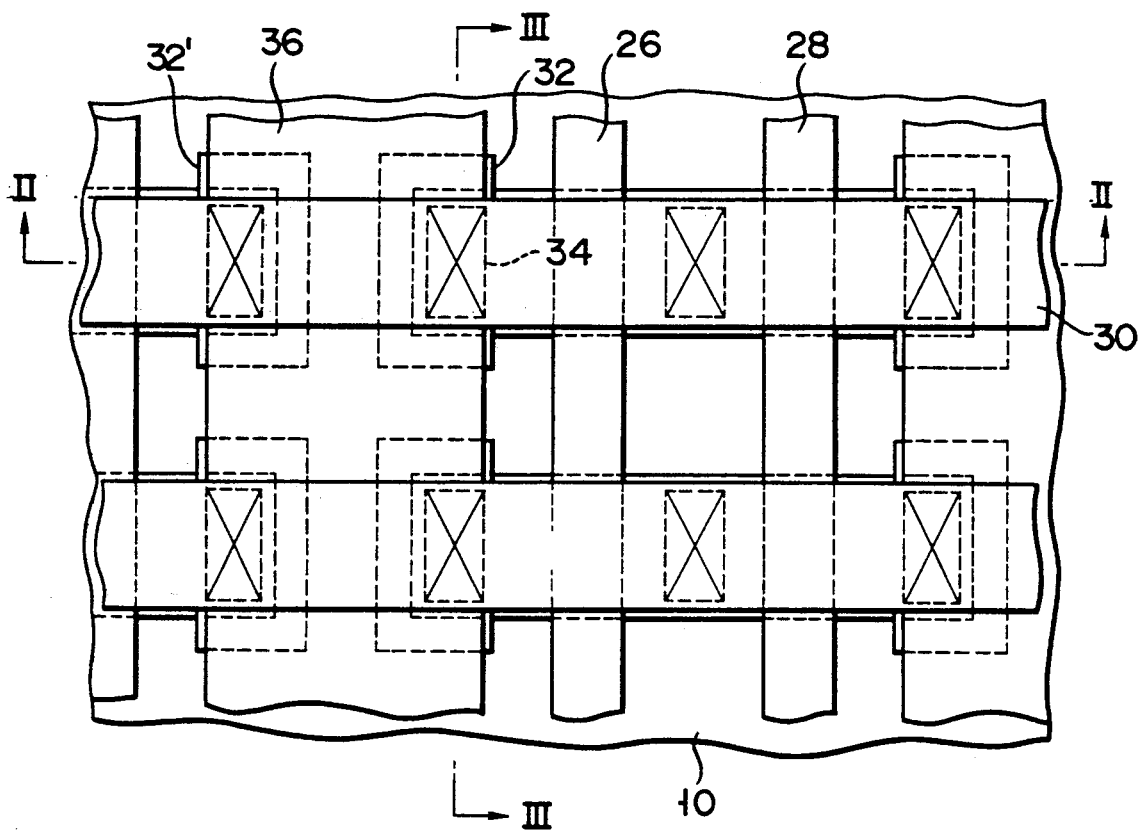
FIG. 1 is a diagram showing a two-dimensional structure of a main part of a dRAM according to a preferred embodiment of the present invention.
Figure 2:
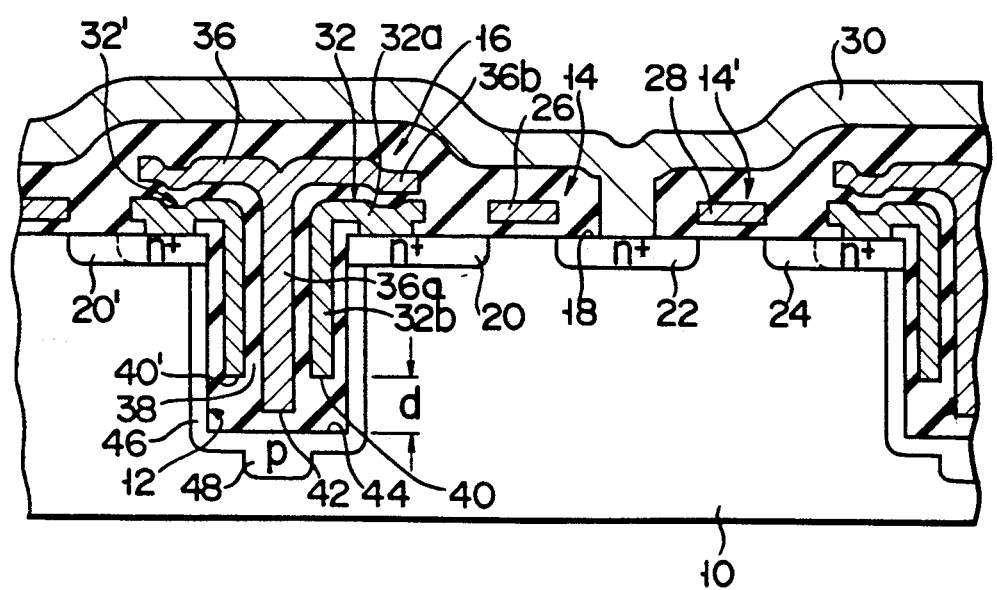
FIG. 2 is a diagram showing a sectional structure of a memory cell of the dRAM taken along the line II–II of FIG. 1.

A dynamic random access memory (dRAM) according to one preferred embodiment of the present invention will be described with reference to FIGS. 1 to 5. FIG. 1 illustrates a two-dimensional structure of a main part of the memory cells of the dRAM. Referring to FIG. 1, reference numeral 10 denotes a semiconductive substrate made of a p− conductivity type silicon. FIG. 2 shows a sectional structure (not drawn to scale) of the two-dimensional structure of FIG. 1 taken along the line II–II thereof.

Referring to FIG. 1, the semiconductive substrate 10 consists of p− conductivity type silicon. Grooves 12 having rectangular sections are formed in a matrix manner (mesh manner) on boundary regions (i.e., field regions) of cell regions defined on the substrate 10. The surface area of the substrate 10 thus comprises a three-dimensional pattern comprising a plurality of rectangular cubes. The surface portions of the rectangular cubes substantially correspond to memory cell areas. Thus, the memory cells of the dRAM are basically formed on the surface portions defined by the grooves 12. In this manner, the memory cells are arranged on the substrate 10 in a matrix manner.

Each memory cell consists of a metal oxide semiconductor field effect transistor (MOSFET) 14 and a capacitor 16. In FIG. 2, MOSFETs 14 and 14' in two neighbouring cells, respectively, are arranged on a single surface portion 18. Three diffusion layers 20, 22 and 24 are formed in the surface portion 18 to have high concentration n conductivity type. The n+ type layers 20 and 24 serve as source regions of the neighbouring MOSFETs 14 and 14'. The remaining n+ type layer 22 functions as a common drain region of the neighbouring MOSFETs 14 and 14'. Word lines 26 and 28 which also serve as gate layers of the MOSFETs 14 and 14' are electrically insulated from and self-aligned with the source and drain regions. A conductive layer 30 which serves as a bit line of the dRAM extends along the row direction as shown in FIG. 1 and is connected to the common drain region 22 of the neighbouring MOSFETs as shown in FIG. 2.

Cell capacitors are formed in the grooves 12. In each memory cell, a capacitor electrode is constituted not by a diffusion layer formed in the substrate unlike a conventional device but by an independent conductive layer (polycrystalline silicon layers) 32 or 32' buried in the groove 12. The capacitor electrode 32 has a horizontal layer portion 32a and vertical layer portions 32b, 32c and 32d contiguously formed to vertically hang from three sides of the portion 32a in the groove 12. Thus, the capacitor electrode 32 covers an end portion of a rectangular cubic memory cell area defined on the substrate 10. This capacitor electrode 32 has an inverted L-shaped section in FIG. 2 and an M-shaped section in FIG. 3. The three-dimensional structure of the electrode 32 can be understood better with reference to the perspective view of FIG. 4. The portion 32a of the electrode 32 is connected to a source region 20 of a corresponding MOSFET. It must be noted that a dotted line 34 in FIG. 1 designates a contact area of the electrode 32 and the source 20.

Figure 4:
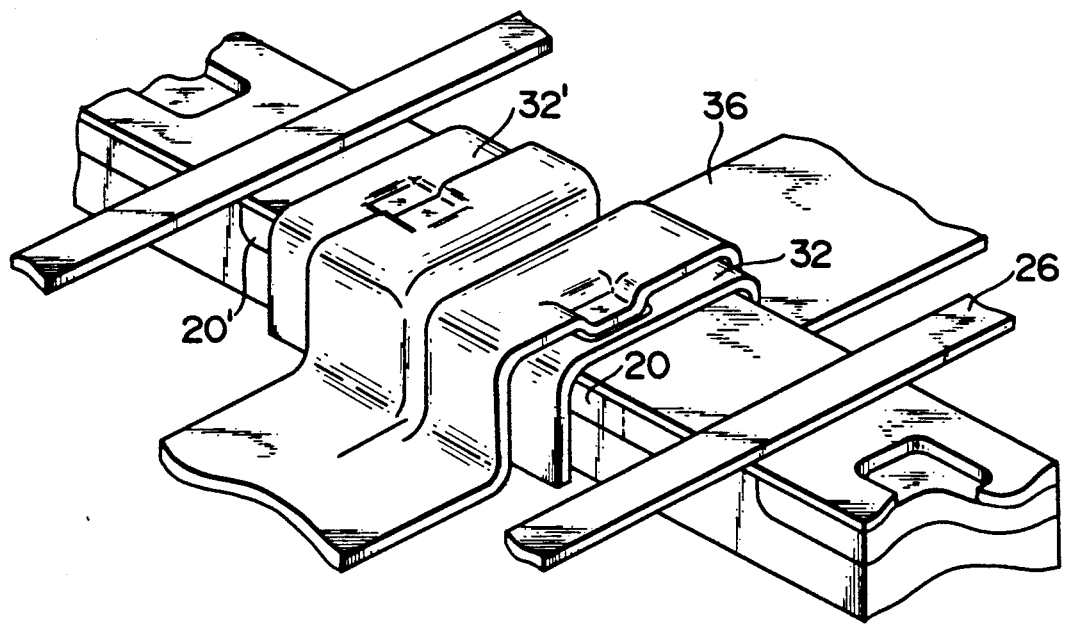
FIG. 4 is a perspective diagram showing a structure of a main part of the memory cell of the dRAM shown in FIG. 1.

A conductive plate layer (polycrystalline silicon layer) 36 extends above the substrate 10 in a three-dimensional pattern configuration as shown in FIG. 4 to have a T-shaped section in the cell capacitor region. FIG. 2 clearly shows that a cell capacitor portion of the layer 36 has a T-shaped section. The layer 36 and the electrodes 32 and 32' are insulated by an insulative layer 38 provided in the groove 12. A vertical portion 36a of the layer 36 extends substantially perpendicularly to the substrate surface along substantially a central portion of the groove 12 having a rectangular section. The neighbouring electrodes 32 and 32' with the groove 12 therebetween oppose each other with the portion 36a sandwiched therebetween. The portion 32a of the electrode 32 opposes a horizontal layer portion 36b of the layer 36. The layer 36 and the single electrode 32 (or 32') constitute a single cell capacitor. Therefore, the charge storage area of the cell capacitor is substantially the same as the surface area of the electrode 32 having an inverted L-shaped section.

Figure 3:
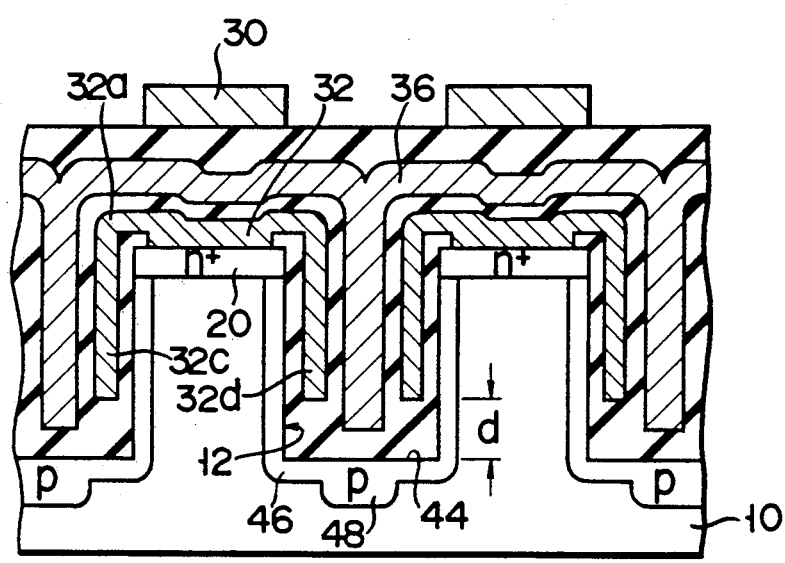
FIG. 3 is a diagram showing a sectional structure of a memory cell of the dRAM taken along the line III–III of FIG. 1.

It should be noted that the portions 32b, 32c and 32d of the electrode 32 having the inverted L-shaped section in the groove 12 are shorter than the portion 36a of the electrode 36 (as shown in FIG. 2 or FIG. 3). In other words, edges 40 (or 40') of the portions 32b, 32c and 32d of the electrodes 32 and 32' are located at shallower positions in the groove 12 compared with an edge 42 of the portion 36a of the electrode 36 and are thus more spaced apart from the bottom 44 of the groove 12 by a corresponding distance.

A shallow semiconductive layer 46 is formed in the p− type substrate 10 to surround the groove 12. The layer 46 has a p conductivity type which is opposite to the conductivity type of the source and drain regions and the same as that of the substrate 10. However, the concentration of the p type impurity of the layer 46 is set to be higher than that of the substrate 10 so that the layer 46 serves as an inversion preventive layer for preventing charge leakage between the capacitor and the substrate. For example, according to the first embodiment, the surface concentration of the p type shallow layer 46 is set to about $1 \times 10^{16}$ to $1 \times 10^{17}$/cm$^3$. End portions of the layer 46 are connected with regions 20 and 20' of MOSFETs of neighbouring cells having the groove 12 therebetween. The junction between the layer 46 and the regions 20 is clearly illustrated in FIG. 3. The bottom of the layer 46 locally extends deeply to form a projection layer 48. The layer 48 prevents leakage current between neighbouring cells having the groove 12 therebetween, thereby allowing further effective element isolation between the neighbouring cells. Leakage current tends to flow between the cells along the surface of the groove 12 in the substrate 10. Therefore, leakage current flow can be prevented by the layer 48.

In a dRAM according to a preferred embodiment of the present invention having the above-mentioned structure, the grooves 12 are formed on the surface areas of the substrate 10. The capacitor 16 of each memory cell is formed in each groove 12. The electrode 32 vertically extends in the groove 12 to increase the capacitor area. Thus, the effective area of each capacitor can be increased without increasing the size of the substrate. Then, the maximum charge storage amount of the cell capacitor can be increased without degrading the cell packing density of the dRAM, thereby improving the signal level of read/write data of the dRAM.

According to the present invention, each cell capacitor 16 buried in the groove 12 formed in the field area comprises first and second conductive layers 40 and 42 which are made of polycrystalline silicon and stacked having an insulative layer sandwiched therebetween. Conventionally, charges are stored in a cell capacitor when the data is stored in the corresponding memory cell, thereby allowing formation of hole-electron pairs in the substrate due to the adverse effect of an α ray. However, according to the present invention, such an effect is reliably prevented, thereby providing a dRAM free from "soft-error", conventionally a critical problem.

Further, according to the present invention, charge leakage, not only between the cell capacitor and the substrate, but also between neighbouring cells with the groove 12 therebetween can be effectively prevented, so that read/write reliability of the dRAM can be increased. Generally, a considerably intense electric field tends to occur between the edges 40 and 40' of the portions 32b, 32c and 32d of the electrodes 32 and 32' and inner edges of the groove 12. Should charge leakage occur, it is most likely to flow between the portions 32b, 32c and 32d of the electrodes 32 and 32' and the inner edges of the groove 12. However, according to the present invention, the lengths of the vertical layer portions of the electrodes 32 and 32' having inverted L-shaped sections are set to be shorter than that of the portion 36a of the layer 36 having a T-shaped section in the groove 12. Therefore, the end portions 40 and 40' of the vertical layer portions of the electrodes 32 and 32' are spaced apart from the inner edges of the groove 12 by an adequate distance d, so that the breakdown voltage of the gate insulation film at the corner of the groove 12 can be increased due to the distance d, thereby suppressing the charge leakage flow between the end portions 40 and 40' and the inner edges of the groove 12. Furthermore, the vertical layer portion 36a of the layer 36 extends downward from the vertical layer portions of the electrodes 32 and 32a so that leakage current flow between the electrodes 40 and 40' can be prevented. This is because a leakage current tends to flow in the layer 38 through the boundary region of itself and the substrate 10.

The inversion preventive layer 46 is provided in the substrate 10 to surround the groove 12 so that the current leakage preventive effect mentioned above can be enhanced. From another point of view, with the provision of the layer 46, the maximum charge storage capacity of the cell capacitor can be increased without considering improvement of the current leakage preventive effect. More particularly, as mentioned above, the vertical layer portions of the electrodes 32 and 32' must be spaced apart from the inner edges of the groove 12 by an adequate distance d. However, since the layer 46 is additionally provided to increase the current leakage preventive effect, the vertical layer portions of the electrodes 32 and 32' can be increased in length, thereby increasing the capacitor area.

The manufacturing steps of the dRAM having the above-mentioned unique structure will now be described with reference to FIGS. 5A to 5E. The same reference numerals as in FIGS. 1 to 4 denote the same or similar portions.

Figure 5A:
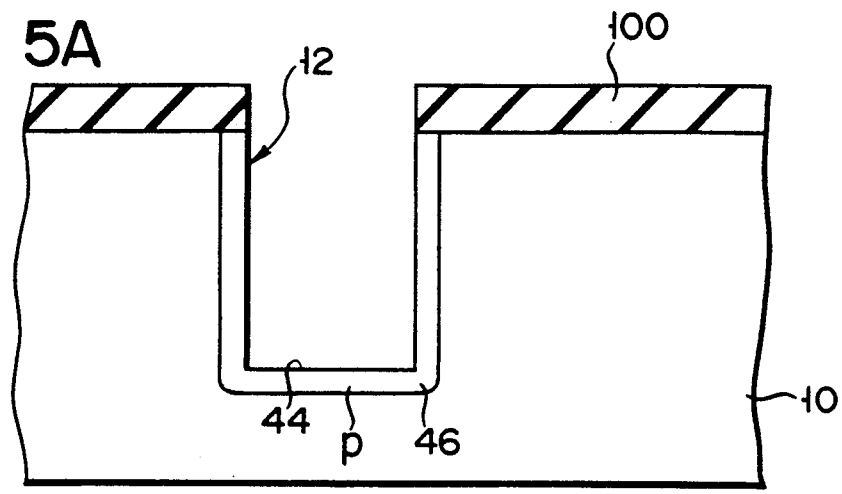
FIGS. 5A to 5E are diagrams, respectively, showing sectional structures of the memory cell in several major manufacturing steps of the dRAM shown in FIG. 1.

First, an oxide film 100 is formed on a p⁻ type (or p type) silicon substrate 10 and patterned to obtain a mask layer having a predetermined shape (for forming grooves). Patterning is preferably performed by anisotropic dry etching such as reactive ion etching (RIE), ion beam etching and sputter etching. Subsequently, the substrate 10 is etched by RIE using the film 100 as a mask to form a groove 12 in an element isolation region (field region) in the substrate 10 as shown in FIG. 5A. As a result, the memory cell region of the substrate 10 has a projecting section. An impurity such as boron is implanted in the recessed surface of the groove 12 to form a p type shallow layer 46 for inversion prevention. The concentration at the surface of the layer 46 is set to about $10^{15}$ to $10^{17}/cm^3$.

Figure 5B:
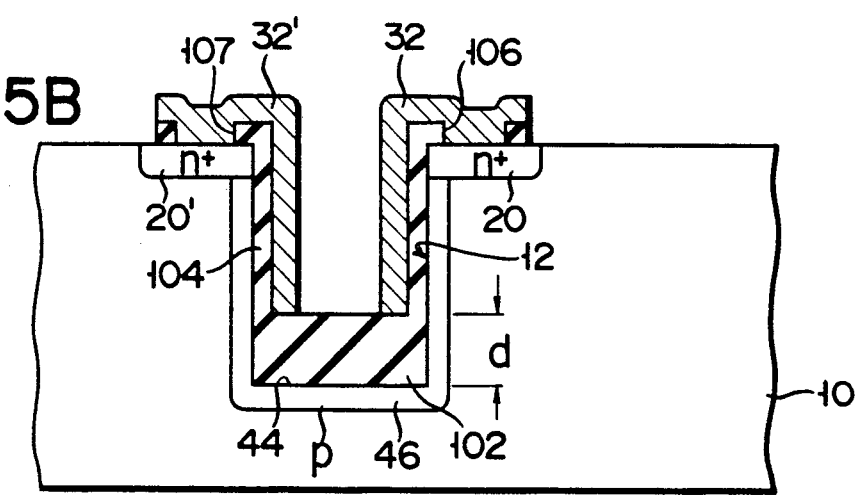

The film 100 is removed with a liquid of $NH_4F$ and so on and thereafter a thin oxide film is formed by thermal oxidation. A thick oxide film 102 is deposited only on the bottom 44 of the groove 12 using the thin film as the mask. The film 102 can be buried in accordance with a flattening technique by etch-back, or by any other burying technique. Then, the thin oxide films on the substrate surface and the groove 12 are removed. Arsenic, e.g., is ion-implanted in end portions of cell regions by using a conventional masking technique to form n⁺ layers 20 and 20'. The layers 20 and 20' serve as source regions of MOSFETs of neighbouring cells with the groove 12 therebetween. Thereafter, a gate oxide layer 104 is formed by thermal oxidation on the groove surface including the side walls of the groove 12. Contact holes 106 and 107 are formed in the layer 104 as shown in FIG. 5B. A first polycrystalline silicon layer is deposited on the entire surface of the layer 104 and the substrate surface and patterned to form capacitor electrodes 32 and 32' connected to the source regions 20 and 20' through the holes 106 and 107, respectively (See FIG. 5B). In this case, the distal end of each capacitor electrode 32 or 32' is spaced apart from the bottom portion of the groove 12 by a distance (=d) corresponding to the thickness of the thick oxide film 102.

Each capacitor electrode 32 extends downward to cover the end portion of the projecting cell formation region as shown in FIG. 5B. The distal end of each capacitor electrode 32 is spaced apart from the bottom portion 44 of the groove 12 by a distance (=d) corresponding t the thickness of the thick film 102. The capacitor electrode having the vertical layer portions as mentioned above can be patterned by utilizing a flattening resist method such as a so-called multi-layer resist method and an anisotropic etching method such as RIE.

Figure 5C:
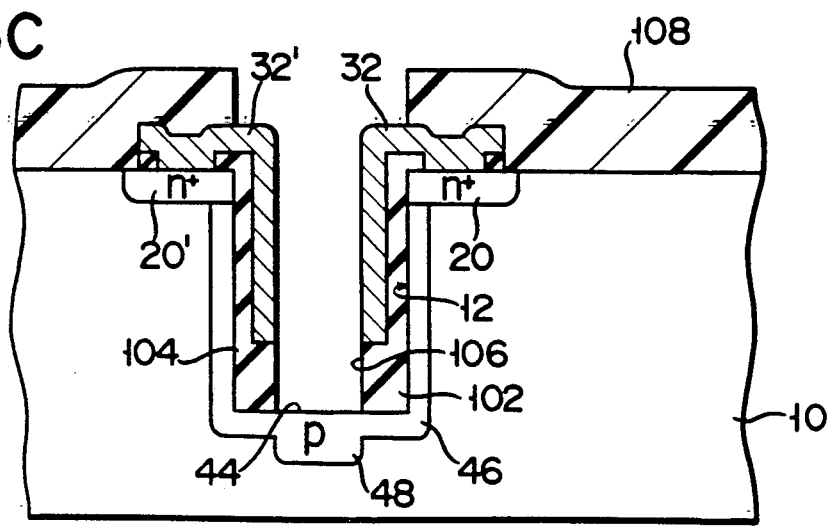

Subsequently, as shown in FIG. 5C, the central portion of the thick film 102 deposited on the bottom portion 44 of the groove 12 is etched to form the through hole 106. A masking layer for the etching is formed by a known technique on horizontal layer portions of the electrodes 32 and 32'. The electrodes 32 and 32' themselves can be used as the masking layer. Then, as shown in FIG. 5C, a patterned photoresist layer 108 is formed on portions of the substrate 10 and the electrodes 32 and 32' by conventional photolithography. U.ing the layer 108, arsenic ions are implanted in the substrate 10 to form a p type layer 46 projecting downward at the central portion thereof. The layer 46 is formed to reliably perform element isolation of neighbouring cells.

Figure 5D:
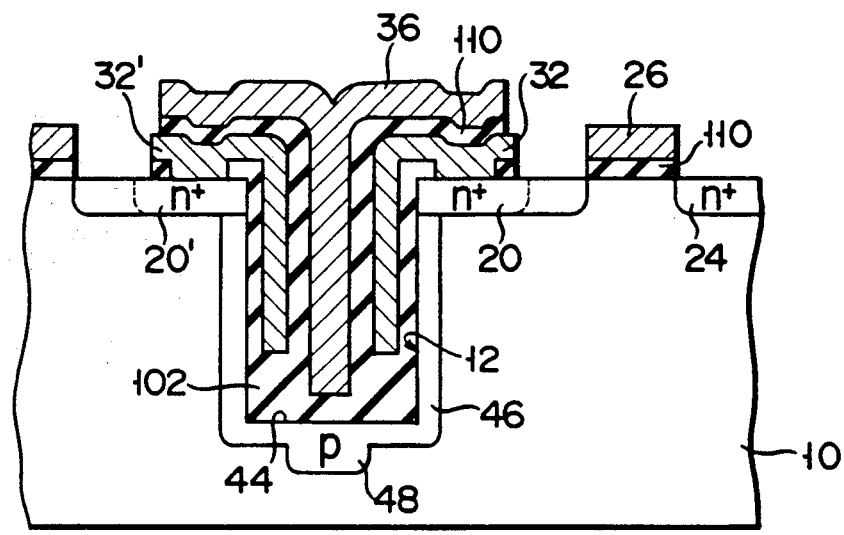
Figure 5E:
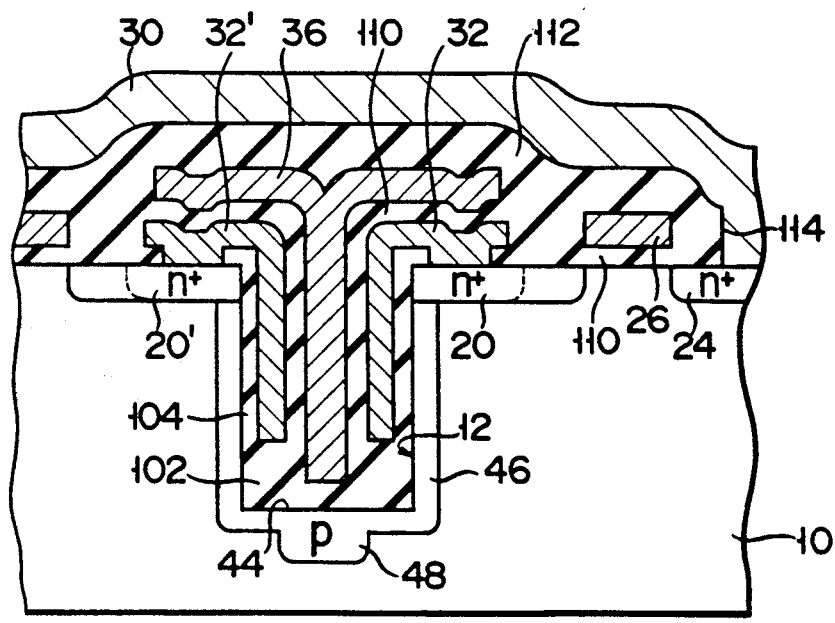

After the pattern 108 is removed, a gate oxide film 110 is formed by thermal oxidation to uniformly cover the inner surface of the through hole 106 formed in the groove 12 and patterned as shown in FIG. 5D. A second polycrystalline silicon layer is deposited on the patterned gate oxide film 110 and patterned to obtain a plate electrode 36 as a common electrode for all the memory capacitors described above, and a gate layer 26 of the MOSFET. It must be noted that the lower portion of the electrode 36 is located closer to the bottom portion 44 of the groove 12 than those of the electrodes 32 and 32'. Then, arsenic ions are implanted in the substrate 10 again to complete n⁺ type source and drain regions 20 and 24 of the MOSFETs.

An oxide film 112 is formed on the layer structure obtained in the step of FIG. 5D using the CVD method and patterned to form a contact hole 114 at a drain region 24 of each MOSFET. An aluminum wiring layer (i.e., bit line) 30 is formed on the film 112 to commonly connect the drain regions of the MOSFETs of the memory cells arranged along the row direction. The dRAM of the present invention is easily manufactured in this manner without requiring any special manufacturing step.

Although the present invention has been shown and described with reference to particular embodiments, various changes and modifications which are obvious to a person skilled in the art to which the invention pertains are deemed to lie within the scope of the invention.

For example, in place of an $SiO_2$ film obtained by thermal oxidation, a gate oxide film can be a film obtained by oxidizing the surface of a multilayer of an oxide film and a nitride film, another oxide film or a nitride film. A high-melting metal such as Mo or a silicide thereof can be used as an electrode material. Other changes and modifications can be made within the spirit and scope of the invention.

What is claimed is:

1. A semiconductor memory device comprising:

(a) a semiconductor substrate of a first conductivity type, having grooves each of which has side walls and a bottom portion; and (b) memory cells formed on said substrate, each of said memory cells comprising:

a transistor formed on said substrate and having a semiconductive source region of a second conductivity type, and a capacitor buried in said groove, said capacitor having, a first conductive layer connected to said source region and having a layer portion extending in said groove along the side wall of said groove, a second conductive layer insulatively provided in said groove to oppose said first layer to allow said first layer to store charge carriers in response to a voltage applied therebetween, said second layer serving as a common electrode for memory capacitors formed on said substrate, and a semiconductive diffusion layer of the first conductivity type, formed in said substrate to surround said groove and having an impurity concentration which is so changed as to define a heavily doped region which is partially positioned at the bottom portion of said groove, wherein said grooves are formed in a field area of said substrate to define memory cell areas having surface portions, and wherein said transistor is formed on each of the surface area portions of said memory cells, and wherein said second conductive layer serving as the common electrode extends at substantially a central portion of said groove to be substantially perpendicular with respect to the substrate surface, and each said layer portion extends substantially perpendicular with respect to the substrate surface and oppose each other with said second conductive layer sandwiched therebetween, and wherein each said layer portion is formed to be shallower than said second conductive layer serving as the common electrode.

2. The device according to claim 1, wherein said first and second conductive layers are constituted by polycrystalline silicon films insulatively stacked with each other.

3. A semiconductor memory device comprising:

(a) a semiconductive substrate of a first conductivity type, having grooves each of which has side walls and a bottom portion; and (b) memory cells formed on said substrate, each of said memory cells comprising;

a transistor formed on said substrate and having a semiconductive source region of a second conductivity type, and a capacitor buried in said groove, said capacitor having, a first conductive layer connected to said source region and having a layer portion extending in said groove along the side wall of said groove;

a second conductive layer insulatively provided in said groove to oppose said first layer to allow said first layer to store charge carriers in response to a voltage applied therebetween, said second layer serving as a common electrode for memory capacitors formed on said substrate, and a semiconductive diffusion layer of the first conductivity type, formed in said substrate to surround said groove and having an impurity concentration which is so changed as to define a heavily-doped region which is partially positioned at the bottom portion of said groove, wherein said diffusion layer comprises:

a lightly-doped diffusion layer of the first conductivity type formed in said substrate to contain therein said groove; and a heavily-doped diffusion layer formed in said substrate to be positioned at a substantially central position of the bottom portion of said groove, wherein two first conductive layers of capacitors of two neighboring memory cells are provided together in said groove in such a manner that said second layer is insulatively sandwiched therebetween in said groove, and wherein said heavily-doped diffusion layer has a width which substantially corresponds to a distance between said two first conductive layers.

4. The device according to claim 3, wherein said layer portion of said first layer extends substantially parallel with the side wall of said groove, while said second layer has a layer portion which extends substantially parallel with the side wall of said groove and which is longer than said layer portion of said first layer, whereby a distal end of said layer portion of said first layer is more spaced apart from the bottom portion of said groove than that of said second layer.

5. The device according to claim 3, wherein said grooves are formed in the surface of said substrate to have rectangular sections, and said first conductive layer is formed to have inverted L-shaped sections along an edge portion of the side wall of said groove.

6. The device according to claim 5, wherein said second conductive layer is formed to have a T-shaped section in said groove, and comprises a layer component extending substantially parallel to the side wall of said groove and deeper than said first conductive layer.

7. The device according to claim 6, wherein said first and second conductive layers are constituted by polycrystalline silicon films insulatively stacked with each other.

8. The device according to claim 7, further comprising an insulative layer formed to fill said groove and electrically separate said first and second conductive layers from each other, said insulative layer being deposited on the bottom portion of said groove to be thicker than an insulative layer portion deposited on said side walls of said groove.

* * * * *